US011430756B2

(12) United States Patent
Huo et al.

(10) Patent No.: US 11,430,756 B2
(45) Date of Patent: Aug. 30, 2022

(54) BONDED SEMICONDUCTOR STRUCTURES HAVING BONDING CONTACTS MADE OF INDIFFUSIBLE CONDUCTIVE MATERIALS AND METHODS FOR FORMING THE SAME

(71) Applicant: YANGTZE MEMORY TECHNOLOGIES CO., LTD., Wuhan (CN)

(72) Inventors: Zongliang Huo, Wuhan (CN); Jun Liu, Wuhan (CN); Jifeng Zhu, Wuhan (CN); Jun Chen, Wuhan (CN); Zi Qun Hua, Wuhan (CN); Li Hong Xiao, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 79 days.

(21) Appl. No.: 16/996,606

(22) Filed: Aug. 18, 2020

(65) Prior Publication Data
US 2020/0381384 A1 Dec. 3, 2020

Related U.S. Application Data

(60) Division of application No. 16/292,273, filed on Mar. 4, 2019, now Pat. No. 10,784,225, which is a
(Continued)

(51) Int. Cl.
*H01L 23/52* (2006.01)
*H01L 23/00* (2006.01)
(Continued)

(52) U.S. Cl.
CPC ........ *H01L 24/19* (2013.01); *H01L 21/76802* (2013.01); *H01L 23/5384* (2013.01);
(Continued)

(58) Field of Classification Search
CPC ......... H01L 21/76802; H01L 23/53238; H01L 23/5384; H01L 24/19; H01L 24/20;
(Continued)

(56) References Cited

U.S. PATENT DOCUMENTS

| 1,002,676 A | 9/1911 | Gray |
| 9,142,587 B2 | 9/2015 | Kobayashi |

(Continued)

FOREIGN PATENT DOCUMENTS

| CN | 104681496 A | 6/2015 |
| CN | 106960834 A | 7/2017 |

(Continued)

OTHER PUBLICATIONS

International Search Report issued in corresponding International Application No. PCT/CN2019/074803, dated Nov. 7, 2019, 4 pages.
(Continued)

*Primary Examiner* — Luan C Thai
(74) *Attorney, Agent, or Firm* — Bayes PLLC

(57) ABSTRACT

Embodiments of bonded semiconductor structures and fabrication methods thereof are disclosed. In an example, a method for forming a semiconductor device is disclosed. A first device layer is formed above a first substrate. A first bonding layer including a first bonding contact is formed above the first device layer. The first bonding contact is made of a first indiffusible conductive material. A second device layer is formed above a second substrate. A second bonding layer including a second bonding contact is formed above the second device layer. The first substrate and the second substrate are bonded in a face-to-face manner, such that the first bonding contact is in contact with the second bonding contact at a bonding interface.

20 Claims, 9 Drawing Sheets

Related U.S. Application Data continuation of application No. PCT/CN2019/074803, filed on Feb. 11, 2019.

(51) Int. Cl.

| | | |
|---|---|---|
| *H01L 21/768* | (2006.01) | |
| *H01L 23/532* | (2006.01) | |
| *H01L 23/538* | (2006.01) | |
| *H01L 25/065* | (2006.01) | |
| *H01L 25/00* | (2006.01) | |
| *H01L 27/1157* | (2017.01) | |
| *H01L 27/11582* | (2017.01) | |

(52) U.S. Cl.
CPC ........ *H01L 23/53238* (2013.01); *H01L 24/20* (2013.01); *H01L 25/0657* (2013.01); *H01L 25/50* (2013.01); *H01L 27/1157* (2013.01); *H01L 27/11582* (2013.01)

(58) Field of Classification Search
CPC . H01L 25/50; H01L 25/0657; H01L 27/1157; H01L 27/11582
USPC .................................. 257/751, 773; 438/618
See application file for complete search history.

(56) References Cited

U.S. PATENT DOCUMENTS

| | | | |
|---|---|---|---|
| 9,299,736 B2* | 3/2016 | Chen | .................. H01L 24/81 |
| 9,451,131 B2 | 9/2016 | Umebayashi et al. | |
| 9,558,945 B2 | 1/2017 | Fukuzumi et al. | |
| 10,090,196 B2* | 10/2018 | Kuang | .................. H01L 23/538 |
| 10,147,732 B1 | 12/2018 | Hu et al. | |
| 10,297,578 B2 | 5/2019 | Tagami et al. | |
| 2013/0307165 A1 | 11/2013 | Wang et al. | |
| 2015/0270304 A1 | 9/2015 | Saito | |
| 2015/0287694 A1 | 10/2015 | Liu et al. | |
| 2015/0364434 A1 | 12/2015 | Chen et al. | |

FOREIGN PATENT DOCUMENTS

| | | |
|---|---|---|
| CN | 109148417 A | 1/2019 |
| CN | 109155301 A | 1/2019 |
| CN | 109219885 A | 1/2019 |
| CN | 109314116 B | 10/2019 |
| TW | 201140838 A | 11/2011 |
| TW | 201735130 A | 10/2017 |

OTHER PUBLICATIONS

Written Opinion of the International Searching Authority issued in corresponding International Application No. PCT/CN2019/074803, dated Nov. 7, 2019, 4 pages.

\* cited by examiner

BONDED SEMICONDUCTOR STRUCTURES HAVING BONDING CONTACTS MADE OF INDIFFUSIBLE CONDUCTIVE MATERIALS AND METHODS FOR FORMING THE SAME

CROSS REFERENCE TO RELATED APPLICATION

This application is division of U.S. application Ser. No. 16/292,273, filed on Mar. 4, 2019, entitled "BONDED SEMICONDUCTOR STRUCTURES HAVING BONDING CONTACTS MADE OF INDIFFUSIBLE CONDUCTIVE MATERIALS AND METHODS FOR FORMING THE SAME," which is continuation of International Application No. PCT/CN2019/074803, filed on Feb. 11, 2019, entitled "BONDED SEMICONDUCTOR STRUCTURES HAVING BONDING CONTACTS MADE OF INDIFFUSIBLE CONDUCTIVE MATERIALS AND METHODS FOR FORMING THE SAME," both of which are hereby incorporated by reference in their entireties.

BACKGROUND

Embodiments of the present disclosure relate to bonded semiconductor structures and fabrication methods thereof.

Planar semiconductor devices, such as memory cells, are scaled to smaller sizes by improving process technology, circuit design, programming algorithm, and fabrication process. However, as feature sizes of the semiconductor devices approach a lower limit, planar process and fabrication techniques become challenging and costly. A three-dimensional (3D) device architecture can address the density limitation in some planar semiconductor devices, for example, Flash memory devices.

A 3D semiconductor device can be formed by stacking semiconductor wafers or dies and interconnecting them vertically using, for instance, through-silicon vias (TSVs) or copper-to-copper (Cu—Cu) connections, so that the resulting structure acts as a single device to achieve performance improvements at reduced power and smaller footprint than conventional planar processes. Among the various techniques for stacking semiconductor substrates, hybrid bonding is recognized as one of the promising techniques because of its capability of forming high-density interconnects.

SUMMARY

Embodiments of semiconductor devices, bonded structures, and fabrication methods thereof are disclosed herein.

In one example, a semiconductor device includes a first semiconductor structure, a second semiconductor structure, and a bonding interface between the first semiconductor structure and the second semiconductor structure. The first semiconductor structure includes a substrate, a first device layer disposed on the substrate, and a first bonding layer disposed above the first device layer and including a first bonding contact. The second semiconductor structure includes a second device layer and a second bonding layer disposed below the second device layer and including a second bonding contact. The first bonding contact is in contact with the second bonding contact at the bonding interface. At least one of the first bonding contact or the second bonding contact is made of an indiffusible conductive material.

In another example, a bonded structure includes a first bonding layer including a first bonding contact and a first dielectric, a second bonding layer including a second bonding contact and a second dielectric, and a bonding interface between the first bonding layer and the second bonding layer. The first bonding contact is in contact with the second bonding contact at the bonding interface, and the first dielectric is in contact with the second dielectric at the bonding interface. Each of the first bonding contact and the second bonding contact is made of a same indiffusible conductive material other than copper (Cu).

In still another example, a method for forming a semiconductor device is disclosed. A first device layer is formed above a first substrate. A first bonding layer including a first bonding contact is formed above the first device layer. The first bonding contact is made of a first indiffusible conductive material. A second device layer is formed above a second substrate. A second bonding layer including a second bonding contact is formed above the second device layer. The first substrate and the second substrate are bonded in a face-to-face manner, such that the first bonding contact is in contact with the second bonding contact at a bonding interface.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
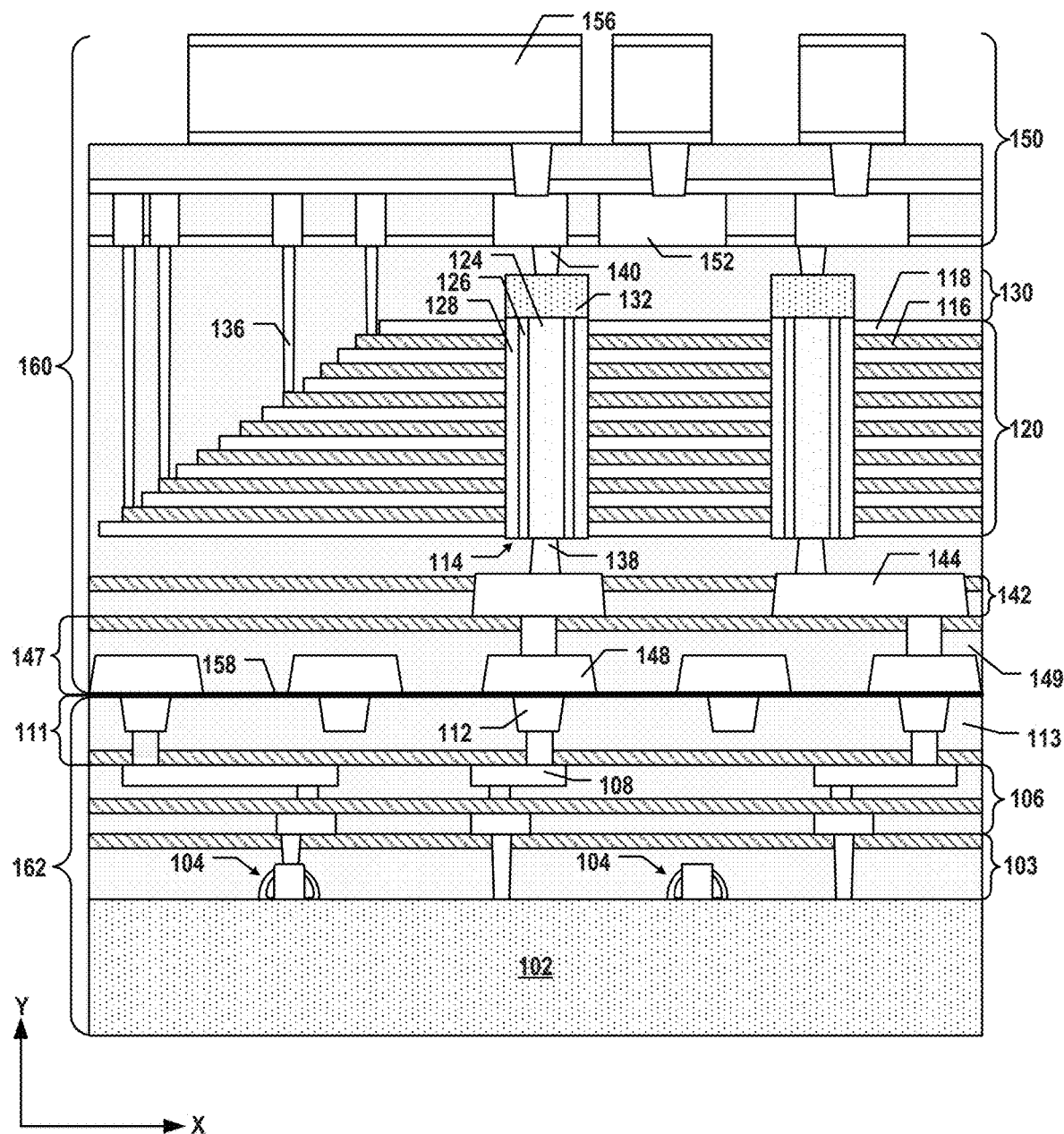
FIG. 1 illustrates a cross-section of an exemplary bonded semiconductor device including bonding contacts made of an indiffusible conductive material, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In the high density, low feature size (e.g., 100 nm) hybrid bonding process, metals of bonding contacts in the two semiconductor structures used as the conductor layers include copper. Copper migration, however, can happen during the hybrid bonding process due to thermal expansion or during the usage life time and thus, can lead to void formation in the bonding contacts after bonding. Moreover, diffusion of copper at the bonding interface is another problem for hybrid bonding, which can cause leakage and shorten electromigration (EM) life of the bonded structure.

Various embodiments in accordance with the present disclosure provide bonding contacts made of an indiffusible conductive material for improving a hybrid bonding interface. By replacing copper with indiffusible conductive materials, copper diffusion through the bonding interface can be avoided, thereby reducing leakage and increasing EM life of the bonded structure. Fabrication processes for forming bonding layers including the bonding contacts made of indiffusible conductive materials can be adjusted from the traditional copper bonding contact processes based on the specific indiffusible conductive material used by the bonding contacts.

FIG. 1 illustrates a cross-section of an exemplary bonded semiconductor device 100 including bonding contacts made of an indiffusible conductive material, according to some embodiments of the present disclosure. For ease of description, bonded semiconductor device 100 will be described as a non-monolithic 3D memory device. However, it is understood that bonded semiconductor device 100 is not limited to a 3D memory device and can include any suitable bonded semiconductor devices that can use bonding contacts made of an indiffusible conductive material to avoid copper diffusion at the bonding interface as described below in detail. It is understood that bonded semiconductor devices that include bonding contacts made of an indiffusible conductive material as disclosed herein are not limited to the example shown in FIG. 1 and can include any other suitable semiconductor devices, such as logic devices, volatile memory devices (e.g., dynamic random-access memory (DRAM) and static random-access memory (SRAM)), and non-volatile memory devices (e.g., NAND or NOR Flash memory), in a 2D, 2.5D, or 3D architecture.

Bonded semiconductor device 100 represents an example of a non-monolithic 3D memory device. The term "non-monolithic" means that the components of bonded semiconductor device 100 (e.g., peripheral devices and memory array devices) can be formed separately on different substrates and then bonded to form a bonded semiconductor device. Bonded semiconductor device 100 can include a substrate 102, which can include silicon (e.g., single crystalline silicon), silicon germanium (SiGe), gallium arsenide (GaAs), germanium (Ge), silicon on insulator (SOI), or any other suitable materials.

It is noted that x and y axes are included in FIG. 1 to further illustrate the spatial relationship of the components in bonded semiconductor device 100 having substrate 102. Substrate 102 includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a semiconductor device (e.g., a bonded semiconductor device 100) is determined relative to the substrate of the semiconductor device (e.g., substrate 102) in the y-direction (i.e., the vertical direction) when the substrate is positioned in the lowest plane of the semiconductor device in the y-direction. The same notion for describing spatial relationship is applied throughout the present disclosure.

Bonded semiconductor device 100 can include two semiconductor structures, i.e., a memory array device chip 160 and a peripheral device chip 162 bonded in a face-to-face manner at a bonding interface 158. In some embodiments, bonding interface 158 is disposed between memory array device chip 160 and peripheral device chip 162 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some embodiments, bonding interface 158 is the place at which memory array device chip 160 and peripheral device chip 162 are met and bonded. In practice, bonding interface 158 can be a layer with a certain thickness that includes the bottom surface of memory array device chip 160 and the top surface of peripheral device chip 162. It is understood that although memory array device chip 160 is disposed above peripheral device chip 162 in FIG. 1, their relative positions can be reversed in some embodiments. For example, memory array device chip 160 can be disposed below peripheral device chip 162 in another bonded semiconductor device.

Peripheral device chip 162 can include a peripheral device layer 103 on substrate 102. Peripheral device layer 103 can include a plurality of transistors 104 formed on substrate 102. Transistors 104 can be formed "on" substrate 102, where the entirety or part of each transistor 104 is formed in substrate 102 (e.g., below the top surface of substrate 102) and/or directly on substrate 102. Isolation regions (e.g., shallow trench isolations (STIs), not shown) and doped regions (e.g., source regions and drain regions of transistors 104, not shown) can be formed in substrate 102 as well.

In some embodiments, peripheral device layer 103 can include any suitable digital, analog, and/or mixed-signal peripheral circuits used for facilitating the operation of bonded semiconductor device 100. For example, peripheral device layer 103 can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors). In some embodiments, peripheral device layer 103 is formed on substrate 102 using complementary metal-oxide-semiconductor (CMOS) technology (in this case, peripheral device chip 162 is also known as a "CMOS chip").

Peripheral device chip 162 can include an interconnect layer 106 (referred to herein as a "peripheral interconnect layer") above peripheral device layer 103 to transfer electrical signals to and from peripheral device layer 103. Peripheral interconnect layer 106 can include a plurality of interconnects 108 (also referred to herein as "contacts"), including lateral interconnect lines and vertical interconnect access (via) contacts. As used herein, the term "interconnects" can broadly include any suitable types of interconnects, such as middle-end-of-line (MEOL) interconnects and back-end-of-line (BEOL) interconnects. Peripheral interconnect layer 106 can further include one or more interlayer dielectric (ILD) layers (also known as "intermetal dielectric (IMD) layers") in which interconnects 108 can form. That is, peripheral interconnect layer 106 can include interconnect lines and via contacts in multiple ILD layers. Interconnects 108 in peripheral interconnect layer 106 can include conductive materials including, but not limited to, copper (Cu), aluminum (Al), tungsten (W), cobalt (Co), silicides, or any combination thereof. In one example, interconnects 108 are made of Cu. In another example, interconnects 108 are made of Al. The ILD layers in peripheral interconnect layer 106 can include dielectric materials including, but not limited to, silicon oxide, silicon nitride, silicon oxynitride, low dielectric constant (low-k) dielectrics, or any combination thereof.

As shown in FIG. 1, peripheral device chip 162 can further include a bonding layer 111 at bonding interface 158 and above peripheral interconnect layer 106 and peripheral device layer 103. Bonding layer 111 can include a plurality of bonding contacts 112 and a dielectric 113 electrically isolating bonding contacts 112. Bonding contacts 112 can be made of an indiffusible conductive material. The remaining area of bonding layer 111 can be formed with dielectric 113 including, but not limited to, silicon oxide, silicon nitride, silicon oxynitride, low-k dielectrics, or any combination thereof. In one example, dielectric 113 is made of silicon oxide. Bonding contacts 112 and dielectric 113 in bonding layer 111 can be used for hybrid bonding as described below in detail. In some embodiments, the step height between dielectric 113 and bonding contacts 112 is between about −20 nm and about 20 nm, such as between −20 nm and 20 nm (e.g., −20 nm, −15 nm, −10 nm, −5 nm, 0 nm, 5 nm, 10 nm, 15 nm, 20 nm, any range bounded by the lower end by any of these values, or in any range defined by any two of these values). That is, the top surface of dielectric 113 may be above the top surface of bonding contacts 112, or vice versa, but not greater than 20 nm.

To avoid Cu diffusion at bonding interface 158 as described above, bonding contacts 112 can be made of an indiffusible conductive material that is not Cu. In some embodiments, the indiffusible conductive material is a metal selected from the group consisting of cobalt (Co), tantalum (Ta), tungsten (W), titanium (Ti), and nickel (Ni). Compared with Cu, the diffusion of Co, Ta, W, Ti, or Ni does not occur at bonding interface 158 during thermal process or during usage life time. In some embodiments, the indiffusible conductive material is a metal nitride selected from the group consisting of cobalt nitride (CoN), tantalum nitride (TaN), tungsten nitride (WN), titanium nitride (TiN), and nickel nitride (NiN). That is, the indiffusible conductive material can be the nitrides of the five metals described above that do not diffuse at bonding interface 158 during thermal process or during usage life time. In some embodiments, the indiffusible conductive material is a metal silicide selected from the group consisting of cobalt silicide (CoSi), tantalum silicide (TaSi), tungsten silicide (WSi), titanium silicide (TiSi), and nickel silicide (NiSi). That is, the indiffusible conductive material can be the cobalt silicides of the five metals described above that do not diffuse at bonding interface 158 during thermal process or during usage life time. Accordingly, the indiffusible conductive material of bonding contacts 112 can be selected from the group consisting of Co, Ta, W, Ti, Ni, CoN, TaN, WN, TiN, NiN, CoSi, TaSi, WSi, TiSi, and NiSi. In some embodiments, bonding contacts 112 are made of more than one indiffusible conductive material described above. In addition to having the indiffusible conductive material(s) as a conductor layer, bonding contacts 112 can also include additional layer(s), such as an adhesion layer, a barrier layer, and/or a seed layer. It is understood that in some embodiments, bonding contacts 112 only includes the conductor layer made of an indiffusible conductive material but does not include any other layers.

In some embodiments, memory array device chip 160 is a NAND Flash memory device in which memory cells are provided in the form of an array of NAND memory strings 114 each extending vertically through memory array device layer 120 and above peripheral device layer 103. Memory array device layer 120 can include NAND memory strings 114 that extend vertically through a plurality of pairs each including a conductor layer 116 and a dielectric layer 118 (referred to herein as "conductor/dielectric layer pairs"). The stacked conductor/dielectric layer pairs are also referred to herein as a "memory stack." Conductor layers 116 and dielectric layers 118 in the memory can stack alternately in the vertical direction.

As shown in FIG. 1, each NAND memory string 114 can include a semiconductor channel 124 and a dielectric layer (also known as a "memory film"). In some embodiments, semiconductor channel 124 includes silicon, such as amorphous silicon, polysilicon, or single crystalline silicon. In some embodiments, the memory film is a composite layer including a tunneling layer 126, a storage layer 128 (also known as a "charge trap/storage layer"), and a blocking layer (not shown). Each NAND memory string 114 can have a cylinder shape (e.g., a pillar shape). Semiconductor channel 124, tunneling layer 126, storage layer 128, and the blocking layer are arranged radially from the center toward the outer surface of the pillar in this order, according to some embodiments. Tunneling layer 126 can include silicon oxide, silicon oxynitride, or any combination thereof. Storage layer 128 can include silicon nitride, silicon oxynitride, silicon, or any combination thereof. The blocking layer can include silicon oxide, silicon oxynitride, high dielectric constant (high-k) dielectrics, or any combination thereof.

In some embodiments, NAND memory strings 114 further include a plurality of control gates (each being part of a word line). Each conductor layer 116 in the memory stack can act as a control gate for memory cell of each NAND memory string 114. Each NAND memory string 114 can include a source select gate at its upper end and a drain select gate at its lower end. As used herein, the "upper end" of a component (e.g., NAND memory string 114) is the end farther away from substrate 102 in the y-direction, and the "lower end" of the component (e.g., NAND memory string 114) is the end closer to substrate 102 in the y-direction.

In some embodiments, memory array device chip 160 further includes a semiconductor layer 130 disposed above and in contact with NAND memory strings 114. Memory array device layer 120 can be disposed below semiconductor layer 130. In some embodiments, semiconductor layer 130 includes a plurality of semiconductor plugs 132 electrically separated by isolation regions. In some embodiments, each semiconductor plug 132 is disposed at the upper end of corresponding NAND memory string 114 and functions as the drain of corresponding NAND memory string 114 and thus, can be considered as part of corresponding NAND memory string 114. Semiconductor plug 132 can include a single crystalline silicon. Semiconductor plug 132 can be un-doped, partially doped (in the thickness direction and/or the width direction), or fully doped by p-type or n-type dopants.

In some embodiments, memory array device chip 160 includes local interconnects that are formed in one or more ILD layers and in contact with components in memory array device layer 120, such as the word lines (e.g., conductor layers 116) and NAND memory strings 114. The local interconnects can include word line via contacts 136, source line via contacts 138, and bit line via contacts 140. Each local interconnect can include conductive materials including, but not limited to, W, Co, Cu, Al, silicides, or any combination thereof. In one example, local interconnects are made of Cu. In another example, local interconnects are made of Al. Word line via contacts 136 can extend vertically through one or more ILD layers. Each word line via contact 136 can be in contact with corresponding conductor layer 116 to individually address a corresponding word line of bonded semiconductor device 100. Each source line via contact 138 can be in contact with the source of corresponding NAND memory string 114. Bit line via contacts 140 can extend vertically through one or more ILD layers. Each bit line via contact 140 can electrically connect to corresponding semiconductor plug 132 (e.g., the drain) of NAND memory string 114 to individually address corresponding NAND memory string 114.

Similar to peripheral device chip 162, memory array device chip 160 can also include interconnect layers for transferring electrical signals to and from NAND memory strings 114. As shown in FIG. 1, memory array device chip 160 can include an interconnect layer 142 (referred to herein as an "array interconnect layer") below memory array device layer 120. Array interconnect layer 142 can include a plurality of interconnects 144, including interconnect lines and via contacts in one or more ILD layers. Interconnects 144 in array interconnect layer 142 can include conductive materials including, but not limited to, Cu, Al, W, Co, silicides, or any combination thereof. In one example, interconnects 144 are made of Cu. In another example, interconnects 144 are made of Al. The ILD layers in array interconnect layer 142 can include dielectric materials including, but not limited to, silicon oxide, silicon nitride, silicon oxynitride, low-k dielectrics, or any combination thereof.

As shown in FIG. 1, memory array device chip 160 can further include a bonding layer 147 at bonding interface 158 and below array interconnect layer 142 and memory array device layer 120. Bonding layer 147 can include a plurality of bonding contacts 148 and a dielectric 149 electrically isolating bonding contacts 148. Bonding contacts 148 can be made of an indiffusible conductive material. The remaining area of bonding layer 147 can be formed with dielectric 149 including, but not limited to, silicon oxide, silicon nitride, silicon oxynitride, low-k dielectrics, or any combination thereof. In one example, dielectric 149 is made of silicon oxide. Bonding contacts 148 and dielectric 149 in bonding layer 147 can be used for hybrid bonding as described below in detail. In some embodiments, the step height between dielectric 149 and bonding contacts 148 is between about −20 nm and about 20 nm, such as between −20 nm and 20 nm (e.g., −20 nm, −15 nm, −10 nm, −5 nm, 0 nm, 5 nm, 10 nm, 15 nm, 20 nm, any range bounded by the lower end by any of these values, or in any range defined by any two of these values). That is, the bottom surface of dielectric 149 may be above the bottom surface of bonding contacts 148, or vice versa, but not greater than 20 nm.

To avoid Cu diffusion at bonding interface 158 as described above, bonding contacts 148 can be made of an indiffusible conductive material that is not Cu. In some embodiments, the indiffusible conductive material is a metal selected from the group consisting of Co, Ta, W, Ti, and Ni. Compared with Cu, the diffusion of Co, Ta, W, Ti, or Ni does not occur at bonding interface 158 during thermal process or during usage life time. In some embodiments, the indiffusible conductive material is a metal nitride selected from the group consisting of CoN, TaN, WN, TiN, and NiN. That is, the indiffusible conductive material can be the nitrides of the five metals described above that do not diffuse at bonding interface 158 during thermal process or during usage life time. In some embodiments, the indiffusible conductive material is a metal silicide selected from the group consisting of CoSi, TaSi, WSi, TiSi, and NiSi. That is, the indiffusible conductive material can be the cobalt silicides of the five metals described above that do not diffuse at bonding interface 158 during thermal process or during usage life time. Accordingly, the indiffusible conductive material of bonding contacts 148 can be selected from the group consisting of Co, Ta, W, Ti, Ni, CoN, TaN, WN, TiN, NiN, CoSi, TaSi, WSi, TiSi, and NiSi. In some embodiments, bonding contacts 148 are made of more than one indiffusible conductive material described above. In addition to having the indiffusible conductive material(s) as the conductor layer, bonding contacts 148 can also include additional layer(s), such as adhesion layer, barrier layer, and/or seed layer. It is understood that in some embodiments, bonding contacts 148 only includes the conductor layer made of an indiffusible conductive material but does not include any other layers.

As described above, bonding contacts 112 in bonding layer 111 of peripheral device chip 162 can be made of a first indiffusible conductive material, and bonding contacts 148 in bonding layer 147 of memory array device chip 160 can be made of a second indiffusible conductive material. In some embodiments, the first indiffusible conductive material is the same as the second indiffusible conductive material, meaning that bonding contacts 112 and bonding contacts 148 at opposite sides of bonding interface 158 are made of the same indiffusible conductive material. In some embodiments, the first indiffusible conductive material is different from the second indiffusible conductive material, meaning that bonding contacts 112 and bonding contacts 148 at opposite sides of bonding interface 158 are made of different indiffusible conductive materials. In some embodiments, the first indiffusible conductive material is different from the second indiffusible conductive material, while both contain the same metal. In one example, one of the first and second indiffusible conductive materials is Co, Ta, W, Ti, or Ni, and the other one of the first and second indiffusible conductive materials is the corresponding nitride or silicide of the first indiffusible conductive material. In another example, the first and second indiffusible conductive materials are the nitride and silicide of the one of Co, Ta, W, Ti, or Ni, respectively (e.g., the first indiffusible conductive material is CoN and the second indiffusible conductive material is CoSi, etc.).

It is understood that in some embodiments, bonding contacts 112 in bonding layer 111 of peripheral device chip 162 or bonding contacts 148 in bonding layer 147 of memory array device chip 160 are not made of an indiffusible conductive material described above. In one example, bonding contacts 112 or bonding contacts 148 are made of Cu. In this example, Cu diffusion may not be fully avoided but can be reduced compared with the existing devices in which bonding contacts at both sides of the bonding interface are made of Cu. In another example, bonding contacts 112 or bonding contacts 148 are made of a conductive material other than Cu and the indiffusible conductive materials described above, such as Al. Nevertheless, at least one of bonding contacts 112 or bonding contacts 148 are made of an indiffusible conductive material described above to reduce or even avoid Cu diffusion at bonding interface 158.

As shown in FIG. 1, another interconnect layer 150 (referred to herein as a "BEOL interconnect layer") can be disposed above memory array device layer 120 and can include interconnects 152, such as interconnect lines and via contacts in one or more ILD layers. BEOL interconnect layer 150 can further include contact pads 156 and a redistribution layer (not shown) at the top portion of bonded semiconductor device 100 for wire bonding and/or bonding with an interposer. BEOL interconnect layer 150 and array interconnect layer 142 can be formed on opposite sides of memory array device layer 120. In some embodiments, interconnects 152 and contact pads 156 in BEOL interconnect layer 150 can transfer electrical signals between bonded semiconductor device 100 and external circuits.

Figure 2:
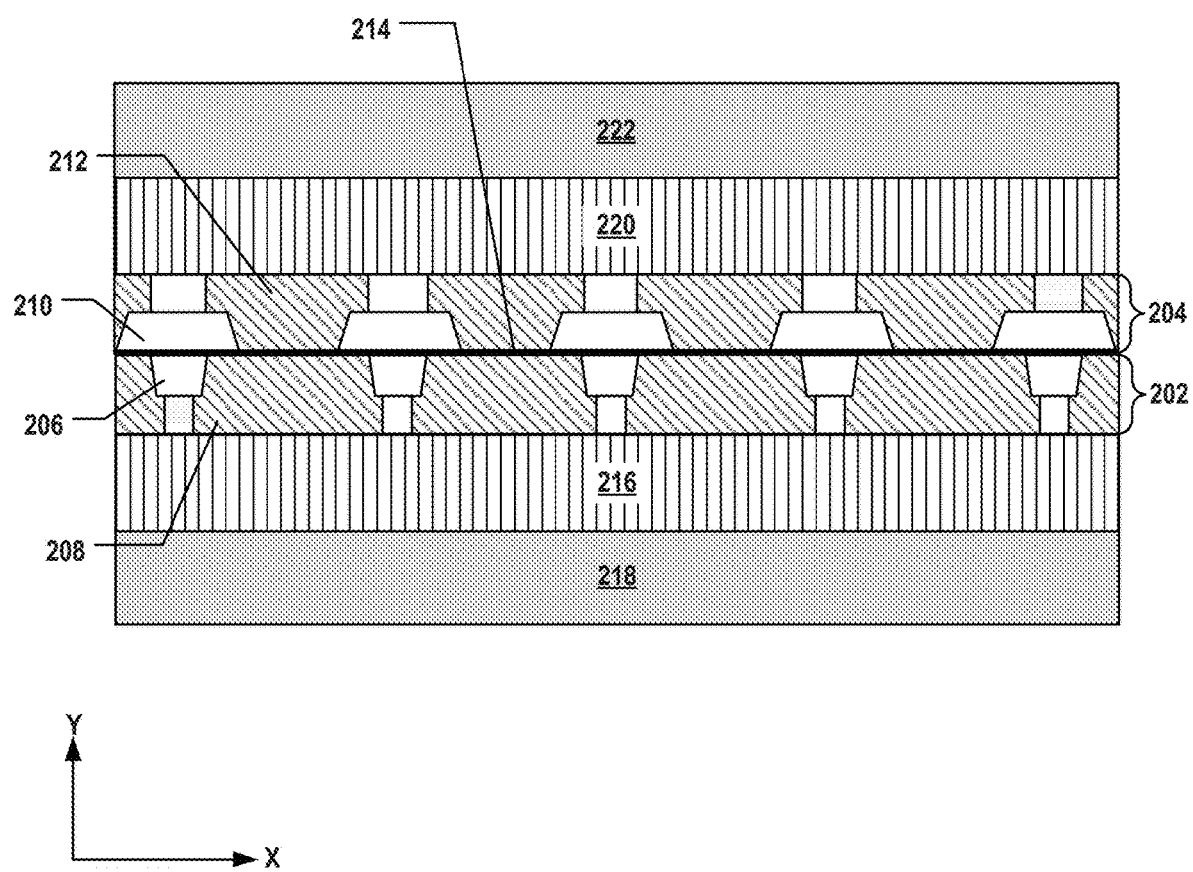
FIG. 2 illustrates a cross-section of an exemplary bonded structure including bonding contacts made of an indiffusible conductive material, according to some embodiments of the present disclosure.

FIG. 2 illustrates a cross-section of an exemplary bonded structure 200 including bonding contacts made of an indiffusible conductive material, according to some embodiments of the present disclosure. FIG. 1 illustrates bonded semiconductor device 100 having bonding contacts made of an indiffusible conductive material, which includes a bonded structure of memory array device chip 160 and peripheral device chip 162. It is understood that the bonding contacts made of an indiffusible conductive material disclosed herein can be used in any suitable bonded structures with various arrangements. FIG. 2 illustrates a bonded structure 200 including a lower bonding layer 202 and an upper bonding layer 204, according to some embodiments. Lower bonding layer 202 can include lower bonding contacts 206 and lower dielectrics 208 electrically isolating lower bonding contacts 206. Similarly, upper bonding layer 204 can include upper bonding contacts 210 and upper dielectrics 212 electrically isolating upper bonding contacts 210. Bonded structure 200 can further include a bonding interface 214 formed between lower bonding layer 202 and upper bonding layer 204.

As shown in FIG. 2, upper bonding contact 210 is in contact with lower bonding contact 206, and upper dielectric 212 is in contact with lower dielectric 208. In some embodiments, at least one of upper bonding contact 210 or lower bonding contact 206 is made of an indiffusible conductive material other than Cu, and upper dielectric 212 and lower dielectric 208 is made of silicon oxide. In some embodiments, each of upper bonding contact 210 and lower bonding contact 206 is made of the same indiffusible conductive material other than Cu. The indiffusible conductive material can be selected from the group consisting of Co, Ta, W, Ti, Ni, CoN, TaN, WN, TiN, NiN, CoSi, TaSi, WSi, TiSi, and NiSi. Upper bonding layer 204 can be bonded with lower bonding layer 202 by hybrid bonding, so that fusion bonding between upper bonding contact 210 and lower bonding contact 206 and SiOx-SiOx covalent bonding between upper dielectric 212 and lower dielectric 208 can be formed simultaneously. In some embodiments, a first step height between upper dielectric 212 and upper bonding contact 210 is between about −20 nm and about 20 nm, and a second step height between lower dielectric 208 and lower bonding contact 206 is between about −20 nm and about 20 nm.

It is understood that bonded structure 200 can include or be combined with other structures, such as device layer(s), interconnect layer(s), and substrate(s), to form any suitable semiconductor devices, for example, logic devices, volatile memory devices (e.g., dynamic random-access memory (DRAM) and static random-access memory (SRAM)), and non-volatile memory devices (e.g., NAND or NOR Flash memory), in a 2D, 2.5D, or 3D architecture. For example. as shown in FIG. 2, bonded structure 200 can further include a lower interconnect layer 216 below lower bonding layer 202 and a lower device layer 218 below lower interconnect layer 216. Bonded structure 200 can further include an upper interconnect layer 220 above upper bonding layer 204 and an upper device layer 222 above upper interconnect layer 220. Depending on the specific type of semiconductor devices having bonded structure 200, upper and lower device layers 222 and 218 can include suitable semiconductor devices (e.g., diodes, transistors, capacitors, inductors, etc.) and any suitable circuits formed by the semiconductor devices.

Figure 3A:
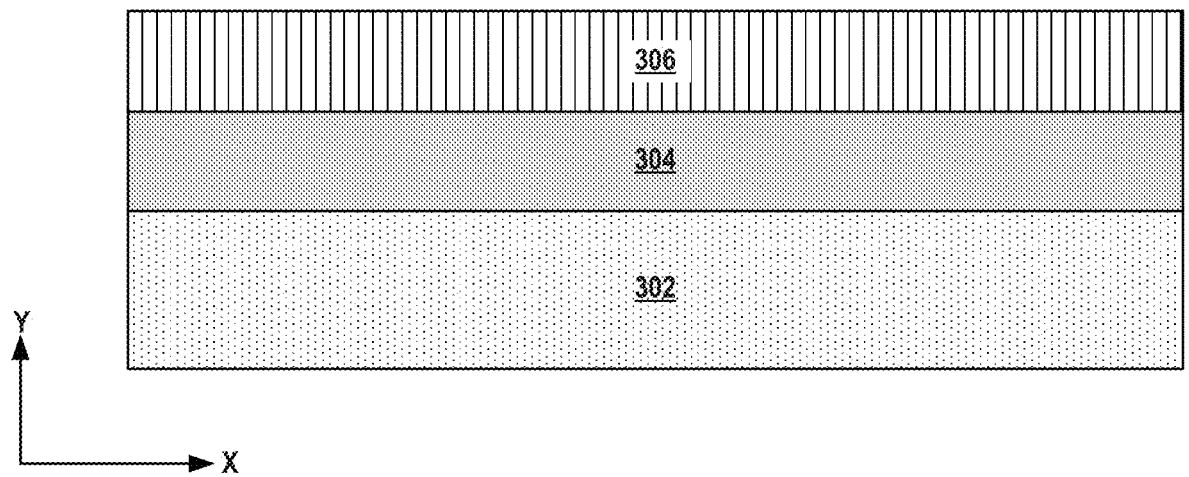
FIGS. 3A-3C illustrate an exemplary fabrication process for forming a first semiconductor structure including bonding contacts made of an indiffusible conductive material, according to some embodiments of the present disclosure.
Figure 3B:
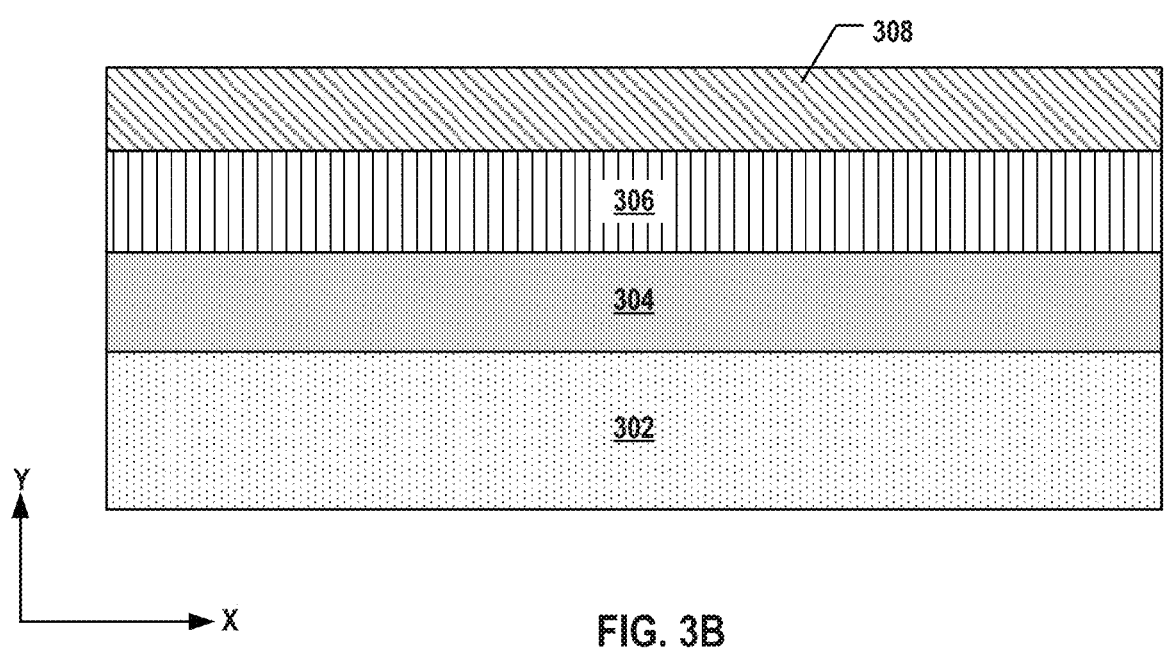
Figure 3C:
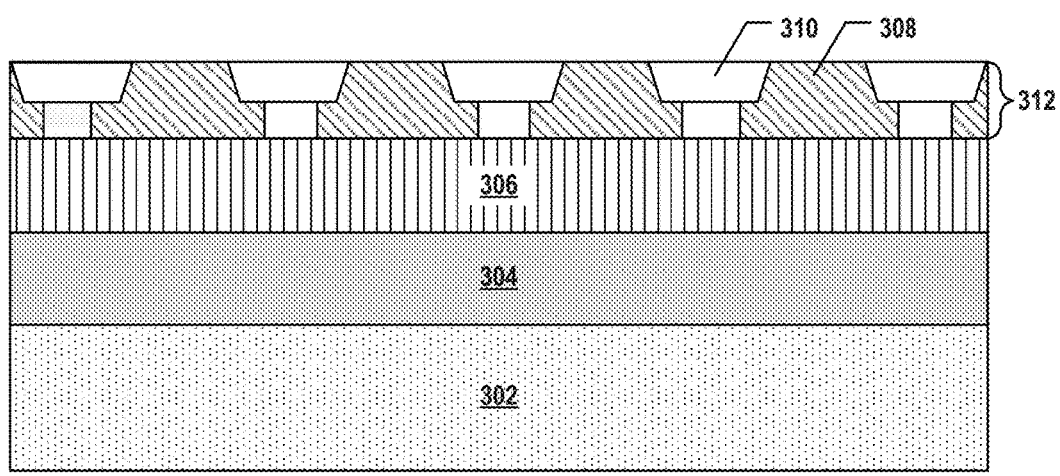
Figure 4A:
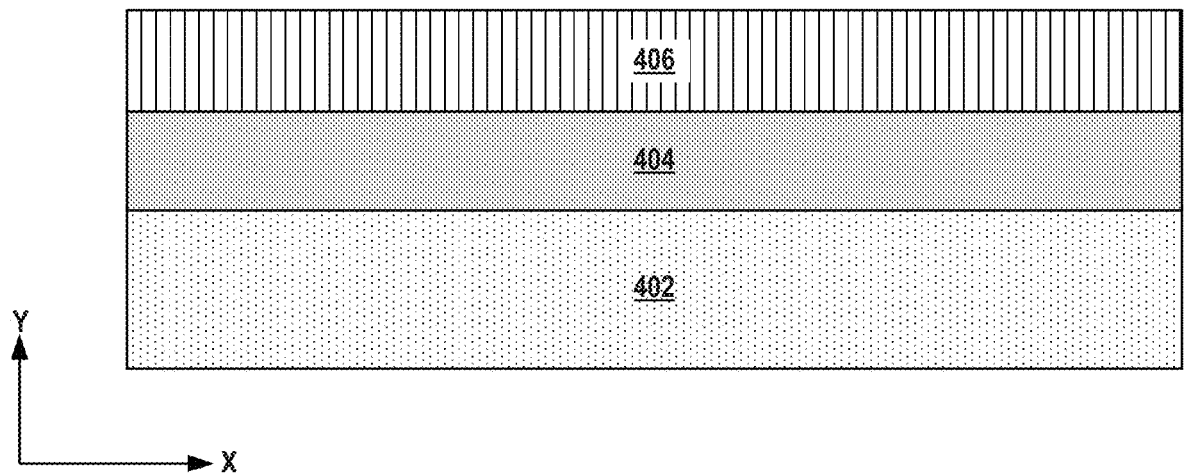
FIGS. 4A-4C illustrate an exemplary fabrication process for forming a second semiconductor structure including bonding contacts made of an indiffusible conductive material, according to some embodiments of the present disclosure.
Figure 4B:
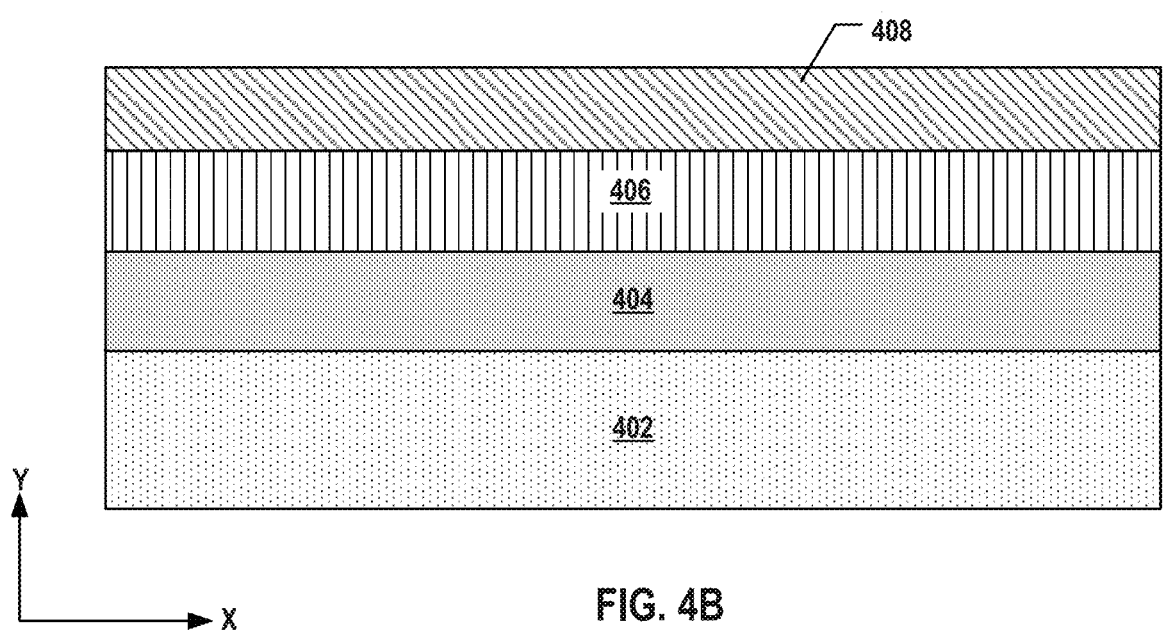
Figure 4C:
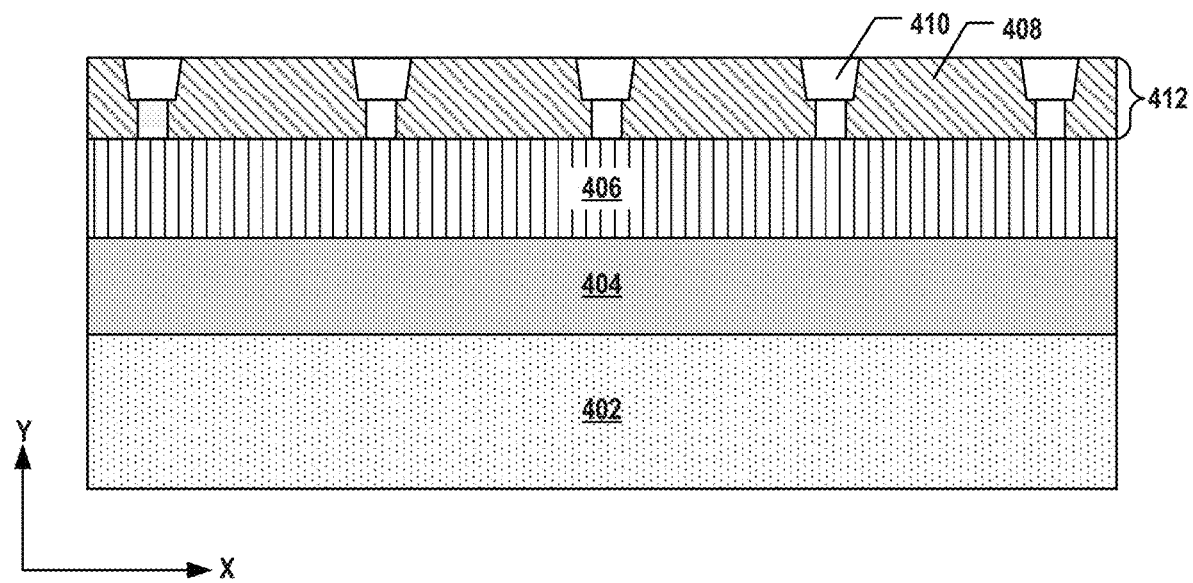
Figure 5A:
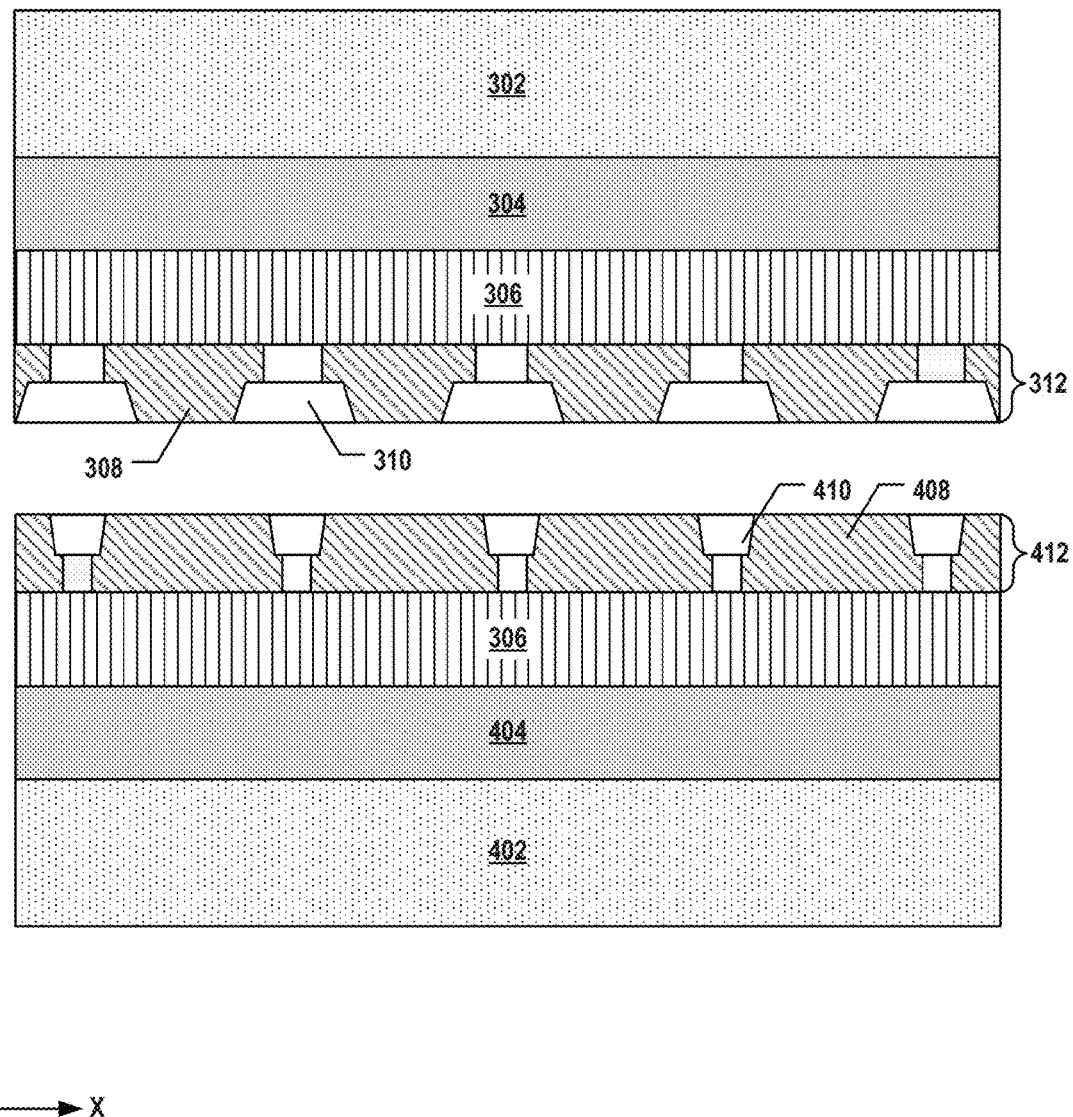
FIGS. 5A-5B illustrate an exemplary fabrication process for bonding the first semiconductor structure and the second semiconductor structure, according to some embodiments of the present disclosure.
Figure 5B:
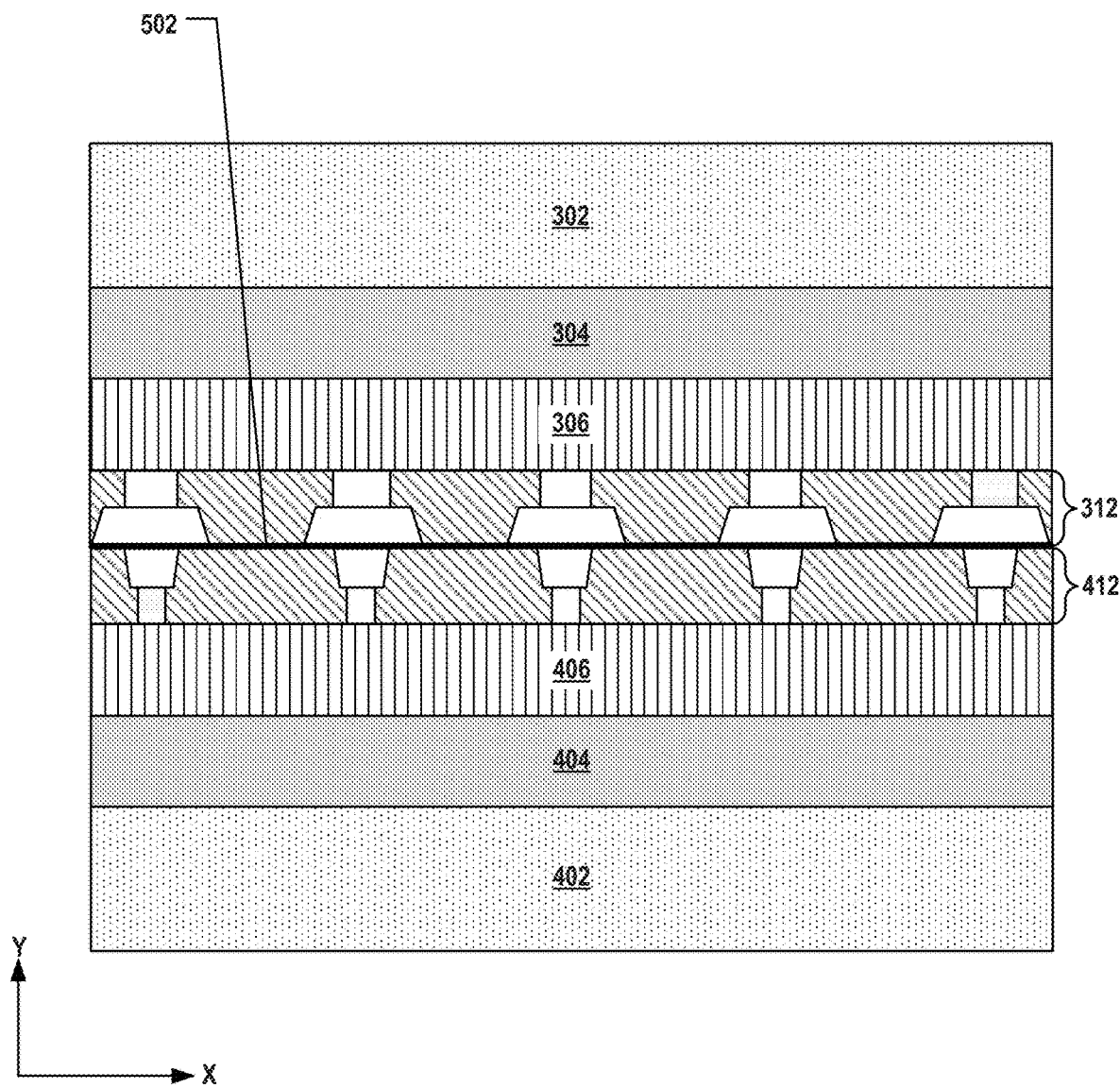
Figure 6:
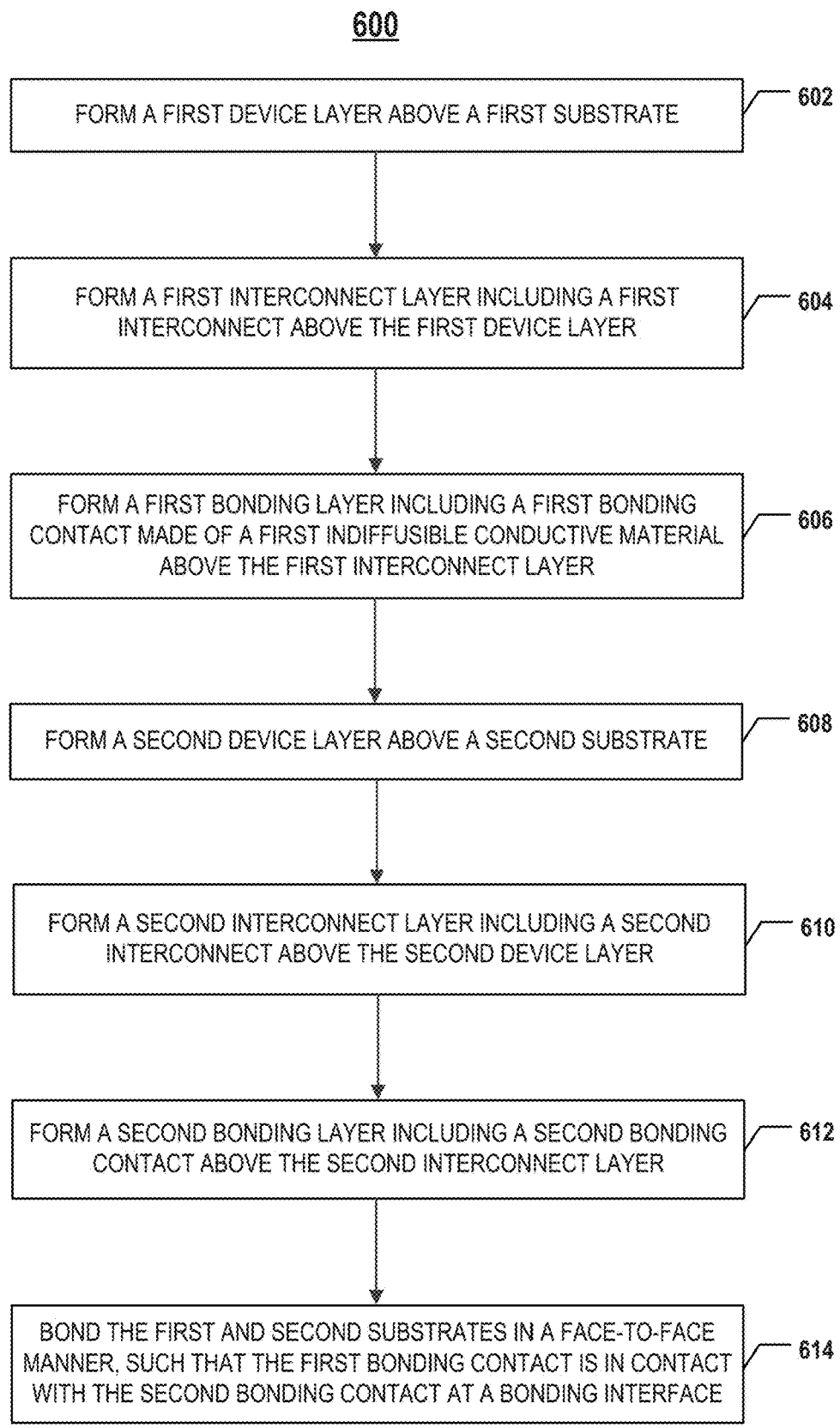
FIG. 6 is a flowchart of an exemplary method for forming a semiconductor device including bonding contacts made of an indiffusible conductive material, according to some embodiments of the present disclosure.

FIGS. 3A-3C illustrate an exemplary fabrication process for forming a first semiconductor structure including bonding contacts made of an indiffusible conductive material, according to some embodiments. FIGS. 4A-4C illustrate an exemplary fabrication process for forming a second semiconductor structure including bonding contacts made of an indiffusible conductive material, according to some embodiments. FIGS. 5A-5B illustrate an exemplary fabrication process for bonding the first semiconductor structure and the second semiconductor structure, according to some embodiments. FIG. 6 is a flowchart of a method 600 for forming an exemplary semiconductor device including bonding contacts made of an indiffusible conductive material, according to some embodiments. Examples of the semiconductor device depicted in FIGS. 3-6 include bonded semiconductor device 100 depicted in FIG. 1. FIGS. 3-6 will be described together. It is understood that the operations shown in method 600 are not exhaustive and that other operations can be performed as well before, after, or between any of the illustrated operations. Further, some of the operations may be performed simultaneously, or in a different order than shown in FIGS. 3-6.

Referring to FIG. 6, method 600 starts at operation 602, in which a first device layer is formed above a first substrate. The first substrate can be a silicon substrate. As illustrated in FIG. 3A, a device layer 304 is formed above a silicon substrate 302. Device layer 304 can be a memory array device layer including a plurality of NAND memory strings (not shown) each extending vertically through a memory stack (not shown) formed above silicon substrate 302.

To form the memory stack, a dielectric stack including an alternating stack of sacrificial layers (e.g., silicon nitride) and dielectric layers (e.g., silicon oxide) can be formed on silicon substrate 302 by one or more thin film deposition processes including, but not limited to, chemical vapor deposition (CVD), physical vapor deposition (PVD), atomic layer deposition (ALD), or any combination thereof. The memory stack then can be formed above silicon substrate 302 by gate replacement processes, i.e., replacing the sacrificial layers in the dielectric stack with conductor layers. In some embodiments, fabrication processes to form the NAND memory strings include forming a semiconductor channel that extends vertically through the dielectric stack, forming a composite dielectric layer (memory film) between the semiconductor channel and the dielectric stack, including, but not limited to, a tunneling layer, a storage layer, and a blocking layer. The semiconductor channel and the memory film can be formed by one or more thin film deposition processes such as ALD, CVD, PVD, any other suitable processes, or any combination thereof.

Method 600 proceeds to operation 604, as illustrated in FIG. 6, in which a first interconnect layer including a first interconnect is formed above the first device layer. As illustrated in FIG. 3A, an array interconnect layer 306 can be formed above memory array device layer 304. Array interconnect layer 306 can include interconnects (not shown), including interconnect lines and via contacts in a plurality of ILD layers, to make electrical connections with memory array device layer 304. In some embodiments, array interconnect layer 306 includes multiple ILD layers and interconnects therein formed by multiple processes. For example, the interconnects can include conductive materials deposited by one or more thin film deposition processes including, but not limited to, CVD, PVD, ALD, electrochemical depositions, or any combination thereof. The ILD layers can include dielectric materials deposited by one or more thin film deposition processes including, but not limited to, CVD, PVD, ALD, or any combination thereof.

Method 600 proceeds to operation 606, as illustrated in FIG. 6, in which a first bonding layer including a first bonding contact made of a first indiffusible material is formed above the first interconnect layer and first device layer. A first dielectric can be formed in the first bonding layer as well. In some embodiments, the first indiffusible conductive material is not Cu. The first indiffusible conductive material can be selected from the group consisting of Co, Ta, W, Ti, Ni, CoN, TaN, WN, TiN, NiN, CoSi, TaSi, WSi, TiSi, and NiSi. The first bonding layer can be flattened by CMP or etching, such that a first step height between the first dielectric and the first bonding contact is between about −20 nm and about 20 nm. In some embodiments, the first interconnect is made of a conductive material (e.g., Cu or Al) other than the first indiffusible conductive material.

As illustrated in FIG. 3B, a dielectric 308 is deposited on the top surface of array interconnect layer 306 by one or more thin film deposition processes including, but not limited to, CVD, PVD, ALD, or any combination thereof. As illustrated in FIG. 3C, bonding contacts 310 are formed in dielectric 308 to form a bonding layer 312 above array interconnect layer 306 and memory array device layer 304. Bonding contact 310 can be formed in multiple processes depending on the specific indiffusible conductive material forming bonding contact 310. In one example, bonding contact 310 can include a barrier/adhesion layer and a conductor layer made of Co, Ta, W, Ti, or Ni deposited subsequently in this order by one or more thin film deposition processes including, but not limited to, CVD, PVD, ALD, electrochemical depositions, or any combination thereof. Fabrication processes to form bonding contact 310 can also include photolithography, CMP, wet/dry etch, or any other suitable processes, to pattern and etch an opening (e.g., a via hole and/or a trench) in which the barrier/adhesion layer and conductor layer can be deposited. In another example, bonding contact 310 made of CoSi, TaSi, WSi, TiSi, or NiSi can be formed by depositing silicon and the respective metal using one or more thin film deposition processes including, but not limited to, CVD, PVD, ALD, electrochemical depositions, or any combination thereof, followed by an anneal (sintering) process resulting in the formation of corresponding metal-Si alloy (metal silicide). In still another example, bonding contact 310 made of CoN, TaN, WN, TiN, or NiN can be formed by depositing the corresponding nitride compound using one or more thin film deposition processes including, but not limited to, CVD, PVD, ALD, electrochemical depositions, or any combination thereof. In some embodiments, bonding contact 310 made of CoN, TaN, WN, TiN, or NiN can be formed by first depositing the corresponding metal, following by nitrogen implantation.

As illustrated in FIG. 3C, the top surface of bonding layer 312 is flattened for future bonding process. To ensure reliable bonding, in some embodiments, the step height between dielectric 308 and bonding contact 310 is between about −20 nm and about 20 nm, such as between −20 nm and 20 nm. Depending on the specific indiffusible conductive material forming bonding contact 310, bonding layer 312 can be flattened by any suitable processes, such as CMP or etching. In one example, bonding contact 310 made of Co, Ta, W, Ti, or Ni can be flattened by a metal CMP process with slurry suitable for polishing metals. In another example, bonding contact 310 made of CoSi, TaSi, WSi, TiSi, or NiSi can be flattened by wet etching and/or drying etching. In still another example, bonding contact 310 made of CoN, TaN, WN, TiN, or NiN can be flattened by wet etching and/or drying etching.

Method 600 proceeds to operation 608, as illustrated in FIG. 6, in which a second device layer is formed above a second substrate. The second substrate can be a silicon substrate. As illustrated in FIG. 4A, a device layer 404 is formed on a silicon substrate 402. Device layer 404 can be a peripheral device layer including a plurality of transistors (not shown) formed on silicon substrate 402 by a plurality of processes including, but not limited to, photolithography, dry/wet etch, thin film deposition, thermal growth, implantation, CMP, and any other suitable processes.

Method 600 proceeds to operation 610, as illustrated in FIG. 6, in which a second interconnect layer is formed above the second device layer. As illustrated in FIG. 4A, a peripheral interconnect layer 406 can be formed above peripheral device layer 404. Peripheral interconnect layer 406 can include interconnects (not shown), including interconnect lines and via contacts in a plurality of ILD layers, to make electrical connections with peripheral device layer 404. In some embodiments, peripheral interconnect layer 406 includes multiple ILD layers and interconnects therein formed by multiple processes. For example, the interconnects can include conductive materials deposited by one or more thin film deposition processes including, but not limited to, CVD, PVD, ALD, electrochemical depositions, or any combination thereof. The ILD layers can include dielectric materials deposited by one or more thin film deposition processes including, but not limited to, CVD, PVD, ALD, or any combination thereof.

Method 600 proceeds to operation 612, as illustrated in FIG. 6, in which a second bonding layer including a second bonding contact is formed above the second interconnect layer. A second dielectric can be formed in the second bonding layer as well. The second bonding contact is made of a second indiffusible conductive material, according to some embodiments. In some embodiments, the second indiffusible conductive material is not Cu. The second indiffusible conductive material can be selected from the group consisting of Co, Ta, W, Ti, Ni, CoN, TaN, WN, TiN, NiN, CoSi, TaSi, WSi, TiSi, and NiSi. The second bonding layer can be flattened by CMP or etching, such that a second step height between the second dielectric and the second bonding contact is between about −20 nm and about 20 nm. In some embodiments, the second interconnect is made of a conductive material (e.g., Cu or Al) other than the second indiffusible conductive material. In some embodiments, the first indiffusible conductive material is the same as the second indiffusible conductive material. In some embodiments, the first indiffusible conductive material is different from the second indiffusible conductive material.

As illustrated in FIG. 4B, a dielectric 408 is deposited on the top surface of peripheral interconnect layer 406 by one or more thin film deposition processes including, but not limited to, CVD, PVD, ALD, or any combination thereof. As illustrated in FIG. 4C, bonding contacts 410 are formed in dielectric 408 to form a bonding layer 412 above peripheral interconnect layer 406 and peripheral device layer 404. Bonding contact 410 can be formed in multiple processes depending on the specific indiffusible conductive material forming bonding contact 410. In one example, bonding contact 410 can include a barrier/adhesion layer and a conductor layer made of Co, Ta, W, Ti, or Ni deposited subsequently in this order by one or more thin film deposition processes including, but not limited to, CVD, PVD, ALD, electrochemical depositions, or any combination thereof. Fabrication processes to form bonding contact 410 can also include photolithography, CMP, wet/dry etch, or any other suitable processes, to pattern and etch an opening (e.g., a via hole and/or a trench) in which the barrier/adhesion layer and conductor layer can be deposited. In another example, bonding contact 410 made of CoSi, TaSi, WSi, TiSi, or NiSi can be formed by depositing silicon and the respective metal using one or more thin film deposition processes including, but not limited to, CVD, PVD, ALD, electrochemical depositions, or any combination thereof, followed by an anneal (sintering) process resulting in the formation of corresponding metal-Si alloy (metal silicide). In still another example, bonding contact 410 made of CoN, TaN, WN, TiN, or NiN can be formed by depositing the corresponding nitride compound using one or more thin film deposition processes including, but not limited to, CVD, PVD, ALD, electrochemical depositions, or any combination thereof. In some embodiments, bonding contact 410 made of CoN, TaN, WN, TiN, or NiN can be formed by first depositing the corresponding metal, following by nitrogen implantation.

As illustrated in FIG. 4C, the top surface of bonding layer 412 is flattened for future bonding process. To ensure reliable bonding, in some embodiments, the step height between dielectric 408 and bonding contact 410 is between about −20 nm and about 20 nm, such as between −20 nm and 20 nm. Depending on the specific indiffusible conductive material forming bonding contact 410, bonding layer 412 can be flattened by any suitable processes, such as CMP or etching. In one example, bonding contact 410 made of Co, Ta, W, Ti, or Ni can be flattened by a metal CMP process with slurry suitable for polishing metals. In another example, bonding contact 410 made of CoSi, TaSi, WSi, TiSi, or NiSi can be flattened by wet etching and/or drying etching. In still another example, bonding contact 410 made of CoN, TaN, WN, TiN, or NiN can be flattened by wet etching and/or drying etching.

Method 600 proceeds to operation 614, as illustrated in FIG. 6, in which the first substrate and the second substrate are bonded in a face-to-face manner, such that the first bonding contact is in contact with the second bonding contact at a bonding interface. The first dielectric can be in contact with the second dielectric as well after the bonding. The bonding can be hybrid bonding.

As illustrated in FIG. 5A, silicon substrate 302 and memory array device layer 304 formed thereon are flipped upside down. Bonding layer 312 facing down is to be bonded with bonding layer 412 facing up, i.e., in a face-to-face manner. In some embodiments, bonding contacts 410 are aligned with bonding contacts 310 prior to hybrid bonding, so that bonding contacts 410 are in contact with bonding contacts 310 after the hybrid bonding, according to some embodiments. In some embodiments, a treatment process, e.g., a plasma treatment, a wet treatment, and/or a thermal treatment, is applied to the bonding surfaces prior to the hybrid bonding. As a result of the hybrid bonding, bonding contacts 410 can be inter-mixed with bonding contacts 310, and dielectric 408 can be covalent-bonded with dielectric 308, thereby forming a bonding interface 502 between bonding layer 412 and bonding layer 312, as shown in FIG. 5B. Silicon substrate 302 is thinned or fully removed after the bonding, according to some embodiments.

It is understood that although memory array device layer 304 is flipped upside down and is above peripheral device layer 404 in the resulting semiconductor device as shown in FIG. 5B, in some embodiments, peripheral device layer 404 is flipped upside down and is above memory array device layer 304 in the resulting semiconductor device. It is further understood that although device layer 304 is illustrated as a memory array device layer and device layer 404 is illustrated as a peripheral device layer, the examples are for illustrative purposes only and do not limit the embodiments of present disclosure. In one example, device layer 304 can be a peripheral device layer, and device layer 404 can be a memory array device layer. In another example, device layers 304 and 404 can be both peripheral device layers. In still another example, device layers 304 and 404 can be both memory array device layers.

According to one aspect of the present disclosure, a semiconductor device includes a first semiconductor structure, a second semiconductor structure, and a bonding interface between the first semiconductor structure and the second semiconductor structure. The first semiconductor structure includes a substrate, a first device layer disposed on the substrate, and a first bonding layer disposed above the first device layer and including a first bonding contact. The second semiconductor structure includes a second device layer and a second bonding layer disposed below the second device layer and including a second bonding contact. The first bonding contact is in contact with the second bonding contact at the bonding interface. At least one of the first bonding contact or the second bonding contact is made of an indiffusible conductive material.

In some embodiments, the indiffusible conductive material is not Cu. In some embodiments, the indiffusible conductive material is selected from the group consisting of Co, Ta, W, Ti, Ni, CoN, TaN, WN, TiN, NiN, CoSi, TaSi, WSi, TiSi, and NiSi.

In some embodiments, the first bonding contact is made of a first indiffusible conductive material, and the second bonding contact is made of a second indiffusible conductive material. In some embodiments, the first indiffusible conductive material is the same as the second indiffusible conductive material. In some embodiments, the first indiffusible conductive material is different from the second indiffusible conductive material.

In some embodiments, the first bonding layer further includes a first dielectric, and the second bonding layer further includes a second dielectric in contact with the first dielectric at the bonding interface. In some embodiments, a first step height between the first dielectric and the first bonding contact is between about −20 nm and about 20 nm, and a second step height between the second dielectric and the second bonding contact is between about −20 nm and about 20 nm. Each of the first dielectric and the second dielectric is made of silicon oxide, according to some embodiments.

In some embodiments, the first semiconductor structure further includes a first interconnect layer including a first interconnect between the first device layer and the first bonding layer, and the second semiconductor structure further includes a second interconnect layer including a second interconnect between the second device layer and the second bonding layer. Each of the first interconnect and the second interconnect is made of a conductive material other than the indiffusible conductive material, according to some embodiments.

In some embodiments, one of the first device layer and the second device layer includes a NAND memory string, and another one of the first device layer and the second device layer includes a peripheral device.

According to another aspect of the present disclosure, a bonded structure includes a first bonding layer including a first bonding contact and a first dielectric, a second bonding layer including a second bonding contact and a second dielectric, and a bonding interface between the first bonding layer and the second bonding layer. The first bonding contact is in contact with the second bonding contact at the bonding interface, and the first dielectric is in contact with the second dielectric at the bonding interface. Each of the first bonding contact and the second bonding contact is made of a same indiffusible conductive material other than Cu.

In some embodiments, the indiffusible conductive material is selected from the group consisting of Co, Ta, W, Ti, Ni, CoN, TaN, WN, TiN, NiN, CoSi, TaSi, WSi, TiSi, and NiSi.

In some embodiments, a first step height between the first dielectric and the first bonding contact is between about −20 nm and about 20 nm, and a second step height between the second dielectric and the second bonding contact is between about −20 nm and about 20 nm. Each of the first dielectric and the second dielectric is made of silicon oxide, according to some embodiments.

According to still another aspect of the present disclosure, a method for forming a semiconductor device is disclosed. A first device layer is formed above a first substrate. A first bonding layer including a first bonding contact is formed above the first device layer. The first bonding contact is made of a first indiffusible conductive material. A second device layer is formed above a second substrate. A second bonding layer including a second bonding contact is formed above the second device layer. The first substrate and the second substrate are bonded in a face-to-face manner, such that the first bonding contact is in contact with the second bonding contact at a bonding interface.

In some embodiments, the second bonding contact is made of a second indiffusible conductive material.

In some embodiments, each of the first indiffusible conductive material and the second indiffusible conductive material is not Cu. In some embodiments, each of the first indiffusible conductive material and the second indiffusible conductive material is selected from the group consisting of Co, Ta, W, Ti, Ni, CoN, TaN, WN, TiN, NiN, CoSi, TaSi, WSi, TiSi, and NiSi.

In some embodiments, the first indiffusible conductive material is the same as the second indiffusible conductive material. In some embodiments, the first indiffusible conductive material is different from the second indiffusible conductive material.

In some embodiments, to form the first bonding layer, a first dielectric is formed in the first bonding layer; to form the second bonding layer, a second dielectric is formed in the second bonding layer; and the first dielectric is in contact with the second dielectric at the bonding interface after the bonding.

In some embodiments, to form the first bonding layer, the first bonding layer is flattened, such that a first step height between the first dielectric and the first bonding contact is between about −20 nm and about 20 nm; and to form the second bonding layer, the second bonding layer is flattened, such that a second step height between the second dielectric and the second bonding contact is between about −20 nm and about 20 nm. The flattening can include CMP or etching.

In some embodiments, each of the first dielectric and the second dielectric is made of silicon oxide.

In some embodiments, a first interconnect layer including a first interconnect is formed between the first device layer and the first bonding layer, and a second interconnect layer including a second interconnect is formed between the second device layer and the second bonding layer. Each of the first interconnect and the second interconnect is made of a conductive material other than the first indiffusible conductive material or the second indiffusible conductive material, according to some embodiments.

In some embodiments, to form one of the first device layer and the second device layer, a NAND memory string is formed; and to form another one of the first device layer and the second device layer, a peripheral device is formed.

In some embodiments, the bonding includes hybrid bonding.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a semiconductor device, comprising:
    forming a first device layer above a first substrate;
    forming a first bonding layer comprising a first bonding contact above the first device layer, wherein the first bonding contact is made of a first indiffusible conductive material;
    forming a second device layer above a second substrate;
    forming a second bonding layer comprising a second bonding contact above the second device layer; and
    bonding the first substrate and the second substrate in a face-to-face manner, the first bonding contact being in contact with the second bonding contact at a bonding interface after the bonding, wherein at least during an annealing process, the first indiffusible conductive material in the first bonding contact does not diffuse to the bonding interface and the second bonding layer.

2. The method of claim 1, wherein the second bonding contact is made of a second indiffusible conductive material.

3. The method of claim 2, wherein each of the first indiffusible conductive material and the second indiffusible conductive material is not Cu.

4. The method of claim 2, wherein each of the first indiffusible conductive material and the second indiffusible conductive material is selected from a group consisting of Co, Ta, W, Ti, Ni, CoN, TaN, WN, TiN, NiN, CoSi, TaSi, WSi, TiSi, and NiSi.

5. The method of claim 2, wherein the first indiffusible conductive material is same as the second indiffusible conductive material.

6. The method of claim 2, wherein the first indiffusible conductive material is different from the second indiffusible conductive material.

7. The method of claim 2, wherein:
    forming the first bonding layer comprises forming a first dielectric in the first bonding layer;
    forming the second bonding layer comprises forming a second dielectric in the second bonding layer; and
    the first dielectric is in contact with the second dielectric at the bonding interface after the bonding.

8. The method of claim 7, wherein:
    forming the first bonding layer further comprises flattening the first bonding layer, a first step height between the first dielectric and the first bonding contact being between about −20 nm and about 20 nm; and
    forming the second bonding layer further comprises flattening the second bonding layer, a second step height between the second dielectric and the second bonding contact being between about −20 nm and about 20 nm.

9. The method of claim 8, wherein the flattening comprises chemical mechanical polishing (CMP) or etching.

10. The method of claim 7, wherein each of the first dielectric and the second dielectric is made of silicon oxide.

11. The method of claim 2, further comprising:
    forming a first interconnect layer comprising a first interconnect between the first device layer and the first bonding layer; and
    forming a second interconnect layer comprising a second interconnect between the second device layer and the second bonding layer,
    wherein each of the first interconnect and the second interconnect is made of a conductive material other than the first indiffusible conductive material or the second indiffusible conductive material.

12. The method of claim 1, wherein:
forming one of the first device layer and the second device layer comprises forming a NAND memory string; and
forming another one of the first device layer and the second device layer comprises forming a peripheral device.

13. The method of claim 1, wherein the bonding comprises hybrid bonding.

14. The method of claim 1, wherein:
forming the first bonding layer further comprises forming a first dielectric in the first bonding layer; and
the method further comprises forming the first bonding contact in the first dielectric, comprising:
when the first bonding contact is made of Co, Ta, W, Ti, or Ni, performing a thin film deposition to form the first bonding contact;
when the first bonding contact is made of CoSi, TaSi, WSi, TiSi, or NiSi, performing a deposition process and the annealing process to form the first bonding contact; and
when the first bonding contact is made of CoN, TaN, WN, TiN, or NiN, performing a deposition process and nitrogen implantation to form the first bonding contact.

15. The method of claim 7, wherein the first dielectric comprises a first low-k dielectric material, and the second dielectric comprises a second low-k dielectric material.

16. The method of claim 12, wherein the peripheral device is arranged at one side of the first and second bonding layers, and the NAND memory string is arranged at another side of the first and second bonding layers.

17. A method for forming a semiconductor device, comprising:
forming a first device layer above a first substrate;
forming a first bonding layer comprising a first bonding contact;
forming a second device layer above a second substrate;
forming a second bonding layer comprising a second bonding contact; and
bonding the first substrate and the second substrate in a face-to-face manner, the first bonding contact being in contact with the second bonding contact after the bonding,
wherein:
the first bonding contact is made of an indiffusible conductive material, and at least during an annealing process, the indiffusible conductive material in the first bonding contact does not diffuse to the second bonding contact;
one of the first device layer and the second device layer comprises a NAND memory string, and another one of the first device layer and the second device layer comprises a peripheral device; and
the NAND memory string and the peripheral device are coupled to each other through the first bonding contact and the second bonding contact.

18. The method of claim 17, wherein
forming the first bonding layer further comprises forming a first dielectric in the first bonding layer; and
the method further comprises forming the first bonding contact in the first dielectric, comprising:
when the first bonding contact is made of Co, Ta, W, Ti, or Ni, performing a thin film deposition to form the first bonding contact;
when the first bonding contact is made of CoSi, TaSi, WSi, TiSi, or NiSi, performing a deposition process and the annealing process to form the first bonding contact; and
when the first bonding contact is made of CoN, TaN, WN, TiN, or NiN, performing a deposition process and nitrogen implantation to form the first bonding contact.

19. The method of claim 18, wherein the first dielectric comprises a low-k dielectric material.

20. The method of claim 17, wherein the peripheral device is arranged at one side of the first and second bonding layers, and the NAND memory string is arranged at another side of the first and second bonding layers.

* * * * *